(12) United States Patent
Neubert et al.

(10) Patent No.: US 6,732,337 B1
(45) Date of Patent: May 4, 2004

(54) METHOD AND ARRANGEMENT FOR TESTING THE STABILITY OF A WORKING POINT OF A CIRCUIT

(75) Inventors: Rolf Neubert, Unterhaching (DE); Qinghua Zheng, Taufkirchen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/786,297

(22) PCT Filed: Sep. 1, 1999

(86) PCT No.: PCT/DE99/02740

§ 371 (c)(1),
(2), (4) Date: Mar. 1, 2001

(87) PCT Pub. No.: WO00/14660

PCT Pub. Date: Mar. 16, 2000

(30) Foreign Application Priority Data

Sep. 3, 1998 (DE) .......................................... 198 40 233

(51) Int. Cl.⁷ .............................................. G06F 17/50
(52) U.S. Cl. ..................... 716/4; 716/1; 716/2; 716/6; 330/253; 700/32
(58) Field of Search ................. 716/1, 2, 4, 6; 330/253; 700/32

(56) References Cited

U.S. PATENT DOCUMENTS

| | | | | |
|---|---|---|---|---|
| 5,282,129 A | * | 1/1994 | Losic et al. ..................... 700/32 |
| 5,317,279 A | * | 5/1994 | Zarabadi et al. ............. 330/253 |
| 5,379,231 A | * | 1/1995 | Pillage et al. ................... 716/1 |
| 5,483,462 A | | 1/1996 | Chiang | |

OTHER PUBLICATIONS

J. Levitas, "Global stability analysis of fuzzy controllers using cell mapping methods", Fuzzy sets and systems, NL, North-Holland, Amsterdam, vol. 106, No. 1, Aug. 1999, pp85–97.

M. U. Wimbrow et al., "Use new simulation features to improve your analog designs", EDN Electrical Design news, U.S. Cahners Publishing Co., Newton, Massachusetts, vol. 36, No. 11, May 1991, pp. 151–158, 160.

W. Mathis et al., "Finding all DC equilibrium points of nonlinear circuits", Proceedings of the midwest Symposium on circuits and systems, U.S. New York, IEEE, Bd. Symp. 32, 1989, pp. 462–465.

K.G. Nichols et al., "Overview of spice–like circuit simulation algorithms", IEE Proceedings: Circuit Devices and Systems, GB, Institution of electrical engineers, Stenvenage, vol. 141, No. 4, Aug. 1994, pp. 242–250.

Uwe Feldmann, et al., "Algorithms for Modern Circuit Simulation", Archiv fur Elektronik und Ubertragungstechnik, vol. 46, (1992), No. 4, Hirzel Verlag Stuttgart, pp. 274–285.

R. Neubert, "An Effective Method for the Stability Analysis of Steady States in the Simulation of Large Electrical Networks", In: W.Mathis & P.Noll (eds.), 2 ITG–Diskussionssitzung: Neue Anwendungen theoretischer Konzepte in der Elektrotechnik, pp. 41–48, Berlin (4) 1995, ITG, VDE—Verlag.

L. O. Chua et al., "Computer–Aided Analysis of Electronic Circuits: Algorithms and Computational Techniques", Prentice Hall, 1975, Chapter 13, pp. 509–538.

* cited by examiner

Primary Examiner—Vuthe Siek
Assistant Examiner—Thuan Do
(74) Attorney, Agent, or Firm—Morrison & Foerster LLP

(57) ABSTRACT

A DC transfer curve of a circuit is determined for determining the global dynamics of a circuit and a stability analysis is conducted for points of the DC transfer curve. The results of the stability analysis are at least one stable region and at least one unstable region of the DC transfer curve. This makes it possible to determine sensitivity, speed and process tolerance of the circuit.

12 Claims, 4 Drawing Sheets

METHOD AND ARRANGEMENT FOR TESTING THE STABILITY OF A WORKING POINT OF A CIRCUIT

BACKGROUND OF THE INVENTION

1. Field of the Invention

The invention relates to a method and to an arrangement for checking a stability of an operating point of a circuit.

2. Description of the Related Art

A circuit, particularly an analog electrical circuit (analog circuit), frequently contains inherent instabilities (unstable operating points, unstable points), which are purposefully utilized for meeting given requirements. An example is a current comparator, which compares a reference current intensity with an input current intensity and sets an output voltage to one of two possible values depending on the difference between the two current intensities. Given this current comparator, there are two stable outside positions and one unstable middle position. The current comparator is based on the "flip-flop principle".

It is generally of great interest to determine the stablity of individual operating points of the circuit. For this purpose, it is conventional to generate a system response to individual, local configurations and to evaluate it (see L. O. Chua et al.: "Computer-Aided Analysis of Electronic Circuits: Algorithms and Computational Techniques", Prentice Hall, 1975 (Chua)). Only a local view of the dynamics of the circuit is received, and an extremely intense calculation is required for an evaluation dependent on the time t.

A continuation method for determining a DC transfer curve for a circuit is known from U. Feldmann et al.: "Algorithms for Modern Circuit Simulation", AEÜ, Vol. 46 (1992, No. 4, Hirzel-Verlag Stuttgart, pages 274–285 (Feldmann).

On the basis of an eigenvalue method according to R. Neubert: "An Effective Method for the Stability Analysis of Steady States in the Simulation of Large Electrical Networks", In: W. Mathis & P. Noll (eds.), 2$^{nd}$ ITG discussion: Neue Anwendungen theoretischer Konzepte in der Elektrotechnik, pages 41–48, Berlin, (4) 1995, ITG, VDE-Verlag., a determination is made for an operating point of a circuit as to whether it is an asymptotically stable point (attractor) or an unstable point.

SUMMARY OF THE INVENTION

An object of the invention is to provide a method and an arrangement, which allows direct calculation of a global dynamic for a circuit.

This object is achieved by a method and an associated apparatus for determining a global dynamics of an electrical circuit, comprising the steps of determining a DC transfer curve of the circuit; performing a stability analysis for points of the DC transfer curve, the stability analysis determining for each point whether each point is an asymptotically stable point or an unstable point; determining a stable region of the DC transfer curve based on the asymptotically stable points; determining an unstable region of the DC transfer curve based on the unstable points; and outputting global dynamics of the circuit based on the stable region and the unstable region.

Further developments may include checking a stability of an operating point by the allocation of the operating point to the closest stable region of the DC transfer curve. The DC transfer curve may be determined by a continuation method, and/or the stability analysis may be carried out with an eigenvalue method. In the inventive method, the unstable region may have a process tolerance which is directly proportional to a sensitivity and indirectly proportional to a speed of the circuit, a variable group being defined by the process tolerance, the sensitivity, and the speed. The method may determine this sensitivity, speed, and process tolerance of the circuit. In the invention, the method may further comprise the steps of fixing at least one of the variables in the variable group; and dimensioning remaining unfixed variables in the variable group based on the fixed variables. This method may be used to design a comparator circuit (which may be a current comparator circuit) or a memory circuit. A functionality for designing circuits utilizing at least one instability may be provided by the method. The elements of the invention are explained in greater detail below.

For achieving this object, a method for determining a global dynamic of a circuit is proposed, in which a DC transfer curve of the circuit is determined. A stability analysis is carried out for points of the DC transfer curve that determines whether or not points of the DC transfer curve are asymptotically stable. Furthermore, at least one stable area of the DC transfer curve and at least one unstable area of the DC transfer curve are determined, where each area contains a series of coherent stable or unstable points. Therefore, the dynamics of the circuit is determined by at least one stable area and at least one unstable area. Coherent points are points of the same allocation "stable" or "unstable".

On the basis of a successful determination of the (global) dynamics of the circuit, it is possible to determine a robustness of the circuit for individual points (also: operating points), which are not situated on the DC transfer curve. In an embodiment, an operating point is determined in that the operating point is allocated to the closest stable area of the DC transfer curve. In another embodiment, the DC transfer curve is determined by continuation methods (see Feldmann).

The DC transfer curve contains a stationary state or a plurality of stationary states dependent on a value occupancy of a parameter. For a dynamic system $$G(\dot{v}, \underline{v}, \lambda) = \underline{0} \qquad (1)$$

stationary solutions are determined in that the equation system $$f(\underline{v}, \lambda) := G(\underline{0}, \underline{v}, \lambda) = \underline{0}(\dot{v} = \underline{0}) \qquad (2)$$

is solved, where $\dot{v}$ is a dynamic modification of a state vector, $\underline{v}$ is a state vector and $\lambda$ is a parameter.

Such an equation system (2) can be solved by standard methods, such as Newton method (see Chua).

The continuation method makes it possible to determine a next point on the DC transfer curve in that a next point is estimated in a direction along a probable curve of the DC transfer curve, and this point serves as initial value for the equation (2). Subsequent to a number of iterative steps, the correct next point results, which is actually situated on the DC transfer curve (at least within a prescribed approximation).

In the framework of the stability analysis, the points of the DC transfer curve are examined regarding their stability. On the basis of the eigenvalue method (see Neubert), in particular, asymptotic stability is checked preferably for each point or a fixed number of points on the DC transfer curve. Such a point is defined as an attractor. The attractor is determined in that all points run toward it concerning the stability within a small environment around it. The attractor therefore represents a stable center for its immediate environment.

A separation of the stable outside positions by the unstable middle position can result from the result of the stability analysis, particularly given comparator circuits.

Advantageously, the chronological dependencies of the circuit need not be considered with respect to the described determination of the global dynamics.

On the basis of a plurality of individual local output configurations, an integration (transient analysis) has previously been carried out. The result is interpreted by expert knowledge in order to be able to draw a conclusion regarding the sought global dynamics of the circuit. A time expenditure of up to 30 minutes can be expected for a transient analysis (for only one initial point), whereas it is possible to determine the global dynamics (without expert knowledge) by the method of the present invention in 10 minutes. Therefore, it is also possible to use the method as preprocessing step, which is potentially followed by a transient analysis for individual points, which are of particular interest.

In the framework of an additional embodiment, the unstable region can have a process tolerance ($\Delta T$), which is directly proportional to a sensitivity ($\Delta s$) and indirectly proportional to a speed of the circuit.

In an embodiment or design of an (electrical) circuit, it is advantageous to be able to represent all competing variables at once. Such competing variables are the speed of the circuit, the sensitivity and the process tolerance of the circuit (conditioned by the production). In a design phase of the circuit, specific values for specific target variables are determined for a default in respective cases. For example, the speed and the sensitivity of the circuit are competing targets; a compromise solution is determined between both.

In an embodiment of the invention, the described method is used for designing a comparator circuit, particularly a current comparator circuit. In another embodiment, the method is used for designing a memory circuit.

Generally, the described methods can be particularly utilized for designing circuits, in which at least one instability is used in order to obtain a functionality. Given the current comparator, the instability is used in order to control a high output value (preferably a voltage) with a low current.

For achieving the invention, an arrangement for checking a stability of an operating point of a circuit is also provided, which has a processor unit configured such that:

1) a DC transfer curve of the circuit can be determined;
2) a stability analysis can be carried out for points of the DC transfer curve, which determines whether or not each point is an asymptotically stable point;
3) a stable region of the DC transfer curve contains the asymptotically stable points and an unstable region of the DC transfer curve contains the unstable points;
4) the global dynamics of the circuit are characterized by the at least one stable region and the at least one unstable region.

This arrangement is particularly suitable for implementing the inventive method or one of its previously described further developments.

BRIEF DESCRIPTION OF THE DRAWINGS

Exemplary embodiments of the invention are subsequently explained on the basis of the drawings.

DESCRIPTION OF THE PREFERRED EMBODIMENTS

Figure 1:
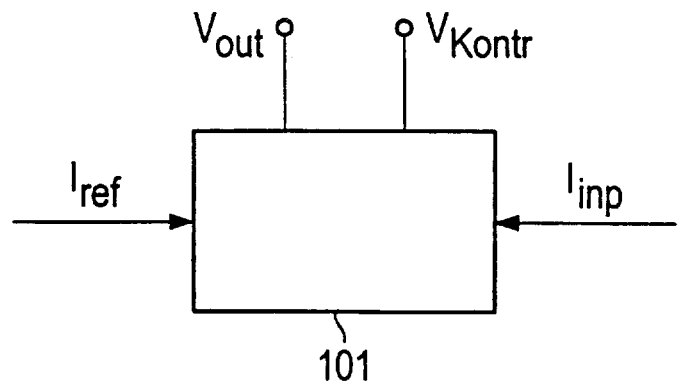
FIG. 1 is a block diagram illustrating input variables and output variables of a current comparator.

FIG. 1 schematically shows a current comparator 101 comparing a reference current $I_{ref}$ to an input current $I_{inp}$ and which indicates the result of the comparison in the form of an output voltage $v_{out}$. A control voltage $v_{kontr}$ is provided for adjusting the current comparator.

Figure 2:
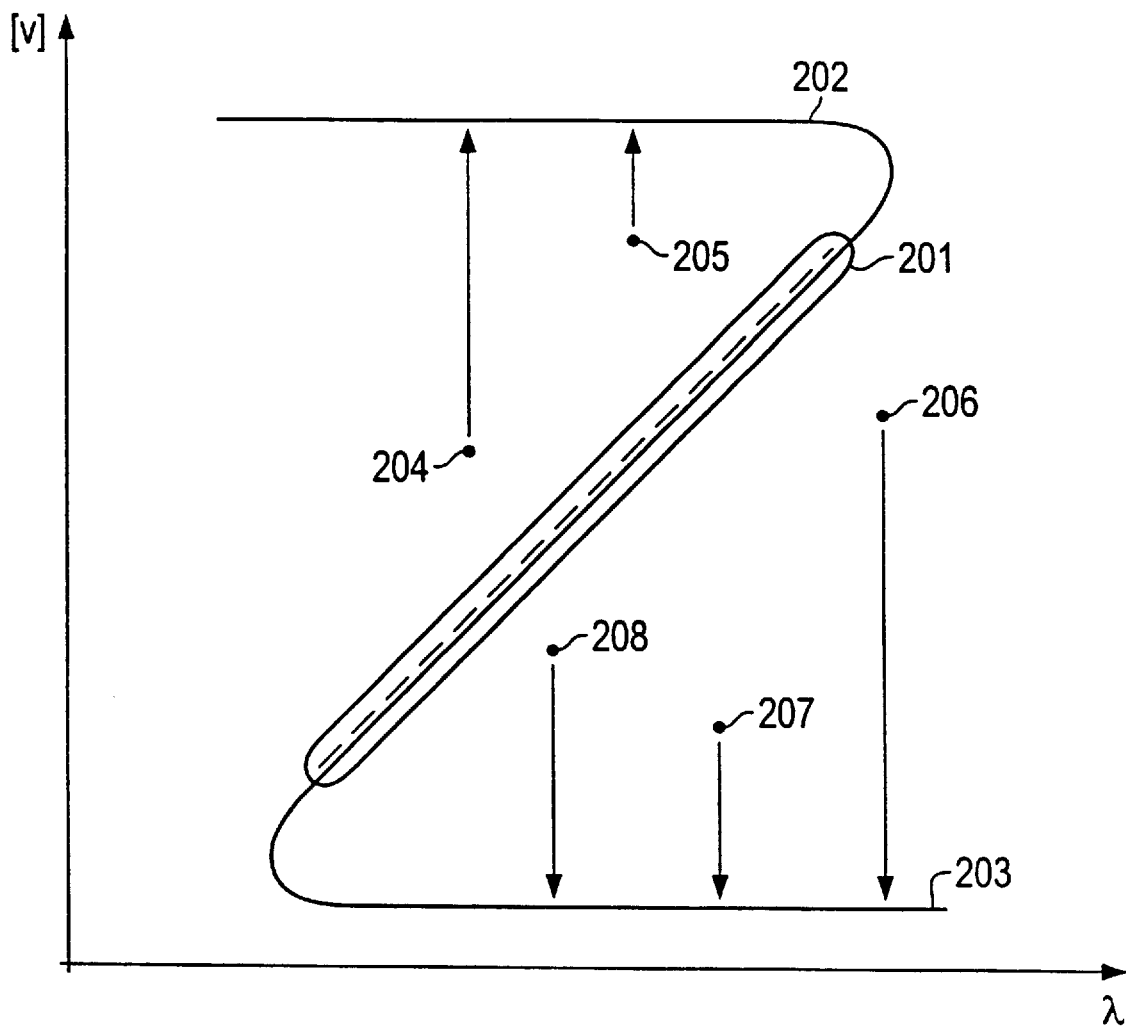
FIG. 2 is a graph representing a global dynamics of a circuit.

FIG. 2 shows the function principle of the current comparator. The current comparator 101 is based on the "flip-flop principle", i.e., respectively one stable outside position 202, 203, to which the output voltage $v_{out}$ adjusts (indicated at the ordinate), is present outside of an unstable middle position 201. Theoretically, $v_{out}$ could also remain in the unstable middle position 201, but this is unlikely with respect to a real technical system. Furthermore, a prediction of a stable outside position 202 or 203 would no longer be possible for operating points on the unstable middle position 201.

The circuit is adjusted by the control voltage $v_{kont}$ close to the unstable middle position ($v_{kontr}$ to "ready"). As a result of the comparison of two current intensities $I_{ref}$ and $I_{inp}$, the output voltage $v_{out}$ moves upward or downward into a stable outside position 202 or 203. This movement is based on the non-linear dynamics of the circuit, which passes into one of the two outside positions 202 or 203 in a very fast and extremely sensitive manner.

The default movement of an operating point (e.g. one of the drawn points 204 to 208) ensues in that a parameter $\lambda$ (compare FIG. 2) is prescribed by which the non-linear dynamics of the circuit (shown by the course of the curve 202, 201 and 203) transfers the operating point into its closest stable outside position. It is thus possible to predict into which stable outside position 202 or 203 the respective operating point passes over. In the example of FIG. 2, the operating points 204 and 205 are switched into the stable outside position 202; the operating points 206, 207 and 208 are switched into the stable outside position 203.

In the example of the above-described current comparator, the parameter $\lambda$ represents a difference $I_{inp}-I_{ref}$ of the current intensity $I_{inp}$ and of the reference current intensity $I_{ref}$ to be compared.

The parameter $\lambda$ represents an additional degree of freedom vis-à-vis a solution vector [v]. Since this solution vector [v] normally has a dimension n, the dimension therefore derives as n+1 on the basis of the parameter $\lambda$. For representation purposes, the solution vector [v] can be reduced to a one-dimensional representation, for example by forming a Euclidian distance of its components.

Figure 3:
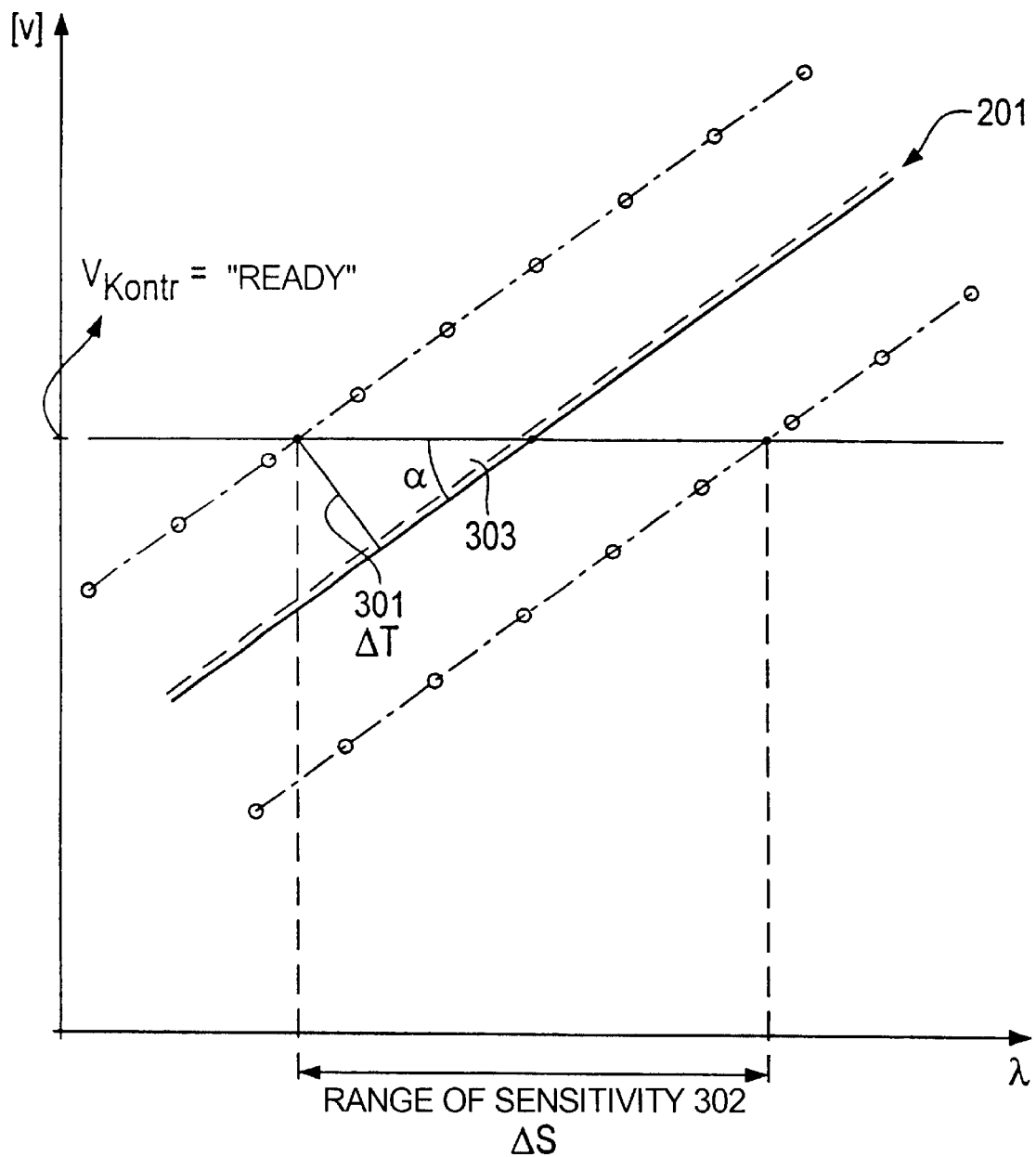
FIG. 3 is a graph representing a section from FIG. 2.

FIG. 3 shows a section of the course of the curve 201 from FIG. 2. Real circuits have a specific "unsharpness" in the region of their unstable middle position 201, this "unsharpness" being referred to as process tolerance 301. This process tolerance 301 results from the production of the circuit (fabrication tolerance). Particularly, physical dimensions are a part of this process tolerance 301. The control voltage $v_{kontr}$ prescribes a sensitivity 302 of the circuit. This sensitivity 302 is determined by the intersecting points of the limits of the process tolerance 301 with the control voltage $v_{kontr}$, where these intersecting points are projected onto the abscissa. Another important variable is the speed of the circuit, for which the angle 303 between the unstable middle position 201 and the control voltage $v_{kontr}$ is a measure (smaller angles correspond to higher speed).

In particular, the relationship $$\Delta s \propto \frac{\Delta T}{\sin\alpha},$$

results with the following implications:

a) It is valid for a fixed speed (angle α=constant): The sensitivity is inversely proportional to the process tolerance ΔT is (the greater the region Δs of the sensitivity on the abscissa in FIG. 3);

b) It is valid for a fixed process tolerance ΔT (=constant): The higher the speed of the circuit (the smaller the angle α) the lower the sensitivity (the greater the region Δs); and c) It is valid for a prescribed sensitivity (Δs=constant): The greater the process tolerance ΔT, the lower the speed of the circuit (the greater the angle α is).

Therefore, a plurality of targets derive, which compete with one another and which must be weighed against one another in the framework of a circuit design (design of a circuit). Special defaults are met by an appropriate selection of a process tolerance 301. The responsible design specialist must evaluate this on an individual basis for each application case.

Figure 4:
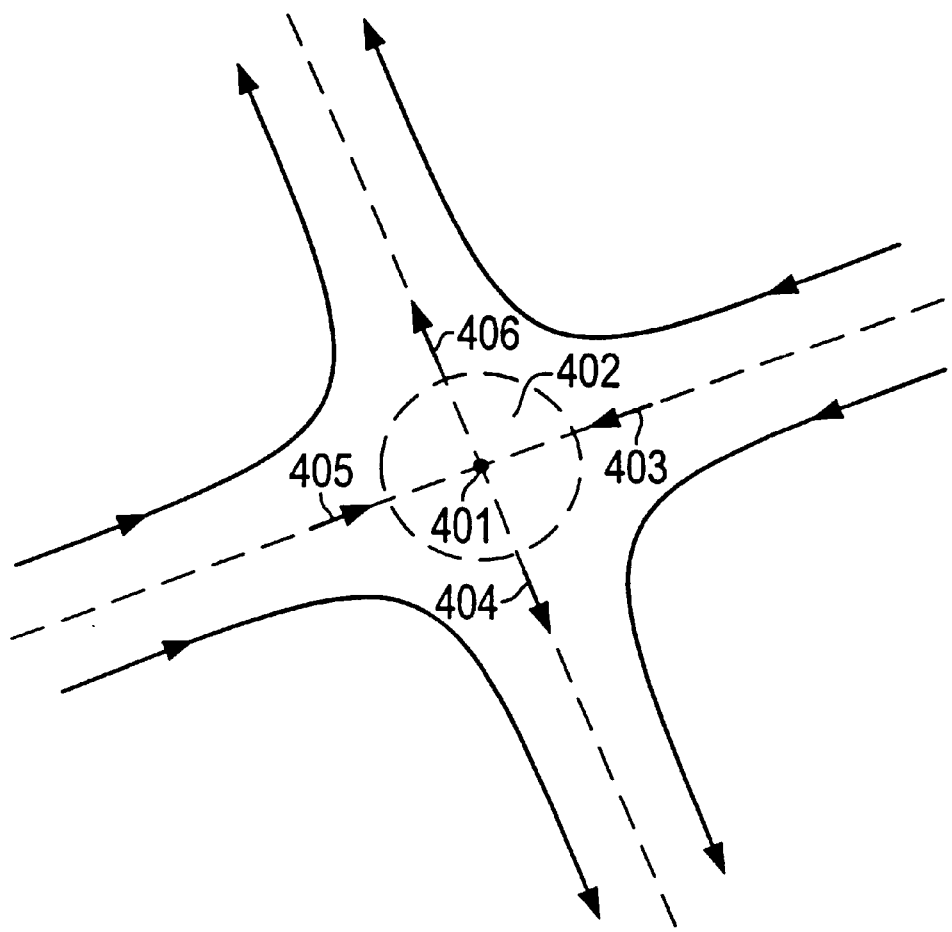
FIG. 4 is a graphic representation of an exemplary point that is not asymptotically stable.
Figure 5:
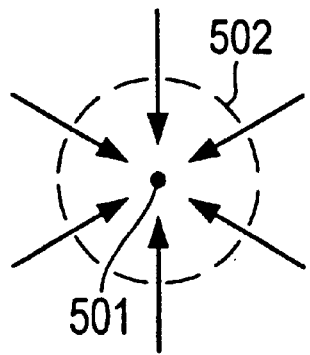
FIG. 5 is a graphic representation of an exemplary point that is asymptotically stable (an attractor)

FIG. 2 shows the course of the curve of the global dynamics of an underlying circuit, where each point on this curve is differentiated as to whether it is an asymptotically stable point (see curve sections 202 and 203) or an unstable point (unstable middle position 201). FIG. 4 shows an example for a point 401 that is not asymptotically stable. In an immediate environment 402 of this point, there are points that run toward to this point 401, e.g. the points on the axis sections 403 and 405. However, there are also points, namely on the axis sections 404 and 406, which run away from the point 401. Therefore, the point 401 is not asymptotically stable. On the other hand, FIG. 5 shows a point 501, in whose immediate environment 502 all points run toward this point. Point 501 therefore is an attractor.

Figure 6:
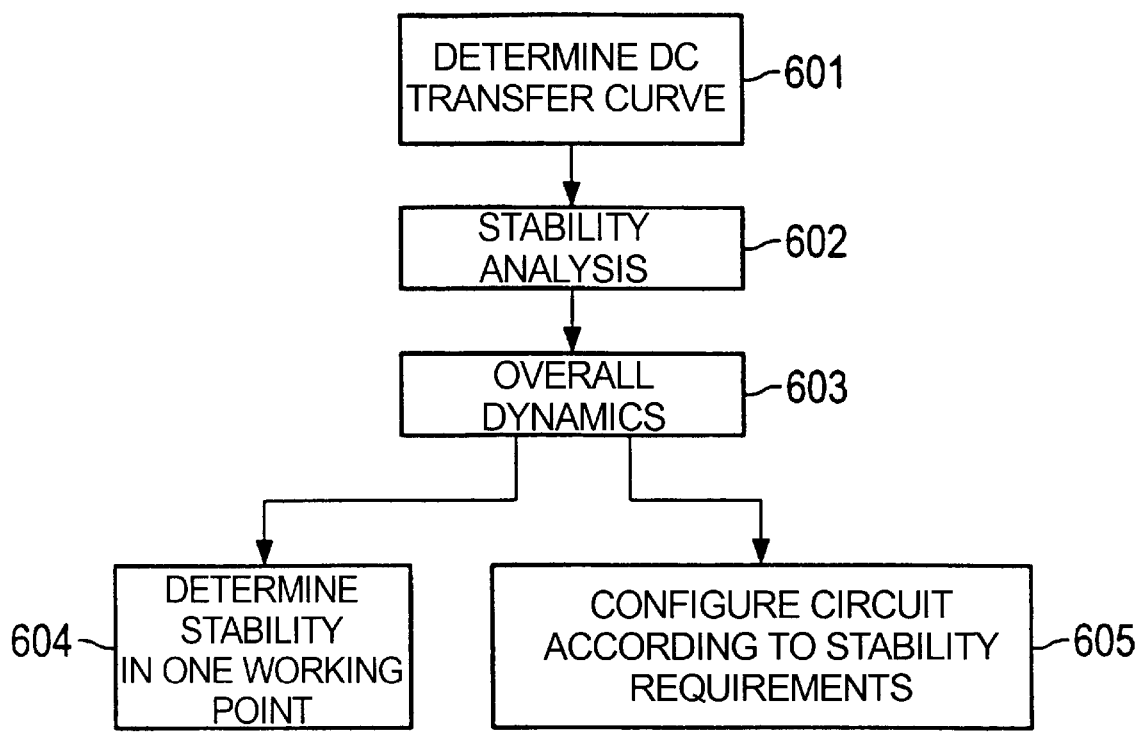
FIG. 6 is a block diagram representing steps for determining the global dynamics of a circuit and application possibilities of these global dynamics.

FIG. 6 shows a block flow diagram comprising steps for determining the global dynamics of a circuit and utilization possibilities of this global dynamics. In a step 601, the DC transfer curve is determined by a continuation method (see Feldmann). Each point or a fixed quantity of points on the DC transfer curve are subjected to a stability analysis (see Neubert; see step 602), to determine whether the point(s) are attractors. Coherent attractors represent a stable outside position and coherent points, which are not attractors, represent the unstable middle position. This results in a course of the curve, which comprises stable outside positions and an unstable middle position and which marks the global dynamics of the underlying circuit (see step 603). Operating points that are not situated exactly on the unstable middle position will assume the closest stable outside position as a stable final condition. In this way, it is possible to determine the stability of an operating point (step 604). Furthermore, a circuit design according to the statements of the global dynamics is alternatively suitably adapted to the circuit, so that specific defaults are met.

Figure 7:
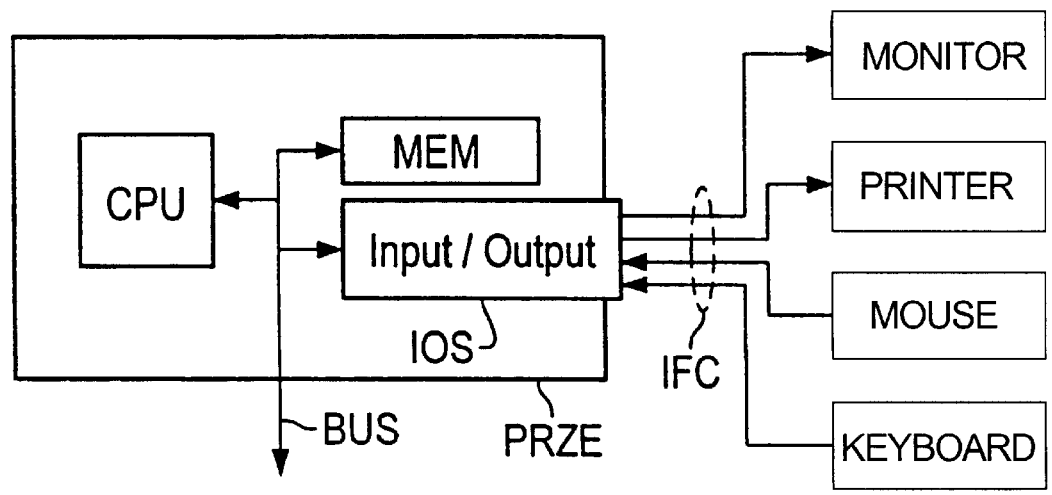
FIG. 7 is a block diagram of a processor unit for implementing the method.

FIG. 7 shows a processor unit PRZE. The processor unit PRZE comprises a processor CPU, a memory MEM and an input/output interface IOS, which is used in different ways via an interface IFC: An output becomes visible at a monitor MON via a graphic interface and/or is outputted on a printer PRT. Inputs occur via a mouse MAS or a keyboard TAST. The processor unit also comprises a data bus BUS assuring the connection of a memory MEM, the processor CPU and of the input/output interface IOS. Furthermore, additional components can be connected to the data bus BUS, e.g. additional memory, data memory (hard disk), or scanner.

The above-described method and apparatus are illustrative of the principles of the present invention. Numerous modifications and adaptations will be readily apparent to those skilled in this art without departing from the spirit and scope of the present invention.

Bibliography

[1] U. Feldmann et al.: "Algorithms for Modern Circuit Simulation", AEÜ, Vol. 46 (1992, No. 4, Hirzel-Verlag Stuttgart, pages 274–285.

[2] R. Neubert: "An Effective Method for the Stability Analysis of Steady States in the Simulation of Large Electrical Networks", In: W. Mathis & P. Noll (eds.), $2^{nd}$ ITG discussion: Neue Anwendungen theoretischer Konzepte in der Elektrotechnik, pages 41–48, Berlin, (4) 1995, ITG, VDE-Verlag.

[3] L. O. Chua et al.: "Computer-Aided Analysis of Electronic Circuits: Algorithms and Computational Techniques", Prentice Hall, 1975.

What is claimed is:

1. A method for determining a global dynamics of an electrical circuit, comprising the steps of:

determining a DC transfer curve of said circuit;

performing a stability analysis for points of said DC transfer curve, said stability analysis determining for each point whether each point is an asymptotically stable point or an unstable point;

determining a stable region of said DC transfer curve based on said asymptotically stable points;

determining an unstable region of said DC transfer curve based on said unstable points; and outputting global dynamics of said circuit based on said stable region and said unstable region.

2. The method according to claim 1, further comprising the step of:

checking a stability of an operating point by the allocation of said operating point to the closest stable region of said DC transfer curve.

3. The method according to claim 1, wherein said DC transfer curve is determined by a continuation method.

4. The method according to claim 1, wherein said stability analysis is carried out with an eigenvalue method.

5. The method according to claim 1, wherein said unstable region has a process tolerance which is directly proportional to a sensitivity and indirectly proportional to a speed of said circuit, a variable group being defined by said process tolerance, said sensitivity, and said speed.

6. The method according to claim 5, further comprising the step of determining said sensitivity, speed, and process tolerance of said circuit.

7. The method for designing a circuit according to claim 1, further comprising the steps of:
   fixing at least one of the variables in said variable group; and
   dimensioning remaining unfixed variables in said variable group based on said fixed variables.

8. The method according to claim 1, further comprising the step of designing a comparator circuit utilizing said global dynamics.

9. The method according to claim 8, wherein said comparator circuit is a current comparator circuit.

10. The method according to claim 1, further comprising the step of designing a memory circuit utilizing said global dynamics.

11. The method according to claim 1, further comprising the step of obtaining a functionality for designing circuits utilizing at least one instability.

12. An arrangement for checking a stability of an operating point of a circuit, comprising:
   a processor unit that comprises a processor, said processor unit being configured to:
   determine a DC transfer curve of said circuit;
   perform a stability analysis that is carried out for points of the DC transfer curve, said stability analysis determining for each point whether each point is an asymptotically stable point or an unstable point;
   determine a stable region of said DC transfer curve based on said asymptotically stable points;
   determine an unstable region of said DC transfer curve based on said unstable points; and
   characterizing global dynamics of said circuit based on said stable region and said unstable region.

* * * * *